(12) United States Patent
Guenther et al.

(10) Patent No.: US 7,510,888 B2
(45) Date of Patent: Mar. 31, 2009

(54) LED ARRANGEMENT

(75) Inventors: Ewald Karl Michael Guenther, Regenstauf (DE); Günter Waitl, Regensburg (DE); Herbert Brunner, Sinzing (DE); Jörg Strauss, Regensburg (DE)

(73) Assignee: Osram Opto Semiconductors GmbH (DE)

(*) Notice: Subject to any disclaimer, the term of this patent is extended or adjusted under 35 U.S.C. 154(b) by 0 days.

(21) Appl. No.: 11/686,525

(22) Filed: Mar. 15, 2007

(65) Prior Publication Data

US 2007/0166853 A1 Jul. 19, 2007

Related U.S. Application Data

(62) Division of application No. 11/119,403, filed on Apr. 29, 2005, now Pat. No. 7,208,769.

(30) Foreign Application Priority Data

Apr. 30, 2004 (DE) .................. 10 2004 021 233

(51) Int. Cl.
*H01L 21/00* (2006.01)
(52) U.S. Cl. .......................... 438/26; 438/29
(58) Field of Classification Search .......... 438/26, 438/29
See application file for complete search history.

(56) References Cited

U.S. PATENT DOCUMENTS 4,485,377 A * 11/1984 Claus et al. .................. 345/82

| | | | |
|---|---|---|---|
| 6,657,379 B2 | 12/2003 | Ellens et al. | |
| 6,784,463 B2 | 8/2004 | Camras et al. | |
| 6,831,302 B2 | 12/2004 | Erchak et al. | |
| 2003/0030368 A1* | 2/2003 | Ellens et al. | 313/503 |
| 2003/0141510 A1 | 7/2003 | Brunner et al. | |
| 2003/0160256 A1 | 8/2003 | Durocher et al. | |
| 2004/0026709 A1* | 2/2004 | Bader et al. | 257/103 |
| 2004/0094757 A1* | 5/2004 | Braune et al. | 257/13 |

FOREIGN PATENT DOCUMENTS

| | | |
|---|---|---|
| DE | 10020465 A1 | 11/2001 |
| DE | 10026255 A1 | 11/2001 |
| EP | 1 248 304 A2 | 10/2002 |
| WO | WP 98/12757 | 3/1998 |

OTHER PUBLICATIONS

Schnitzer, I. et al., "30% external quantum efficiency from surface textured, thin-film light-emitting diodes", *Appl. Phys. Lett.*, vol. 63, No. 16, (Oct. 18, 1993).

* cited by examiner

*Primary Examiner*—Lex Malsawma
(74) *Attorney, Agent, or Firm*—Fish & Richardson P.C.

(57) ABSTRACT

The invention concerns an LED arrangement with at least one LED chip comprising a radiation decoupling surface through which the bulk of the electromagnetic radiation generated in the LED chip is decoupled. Arranged on the radiation decoupling surface is at least one phosphor layer for converting the electromagnetic radiation generated in the LED chip. A housing envelops portions of the LED chip and the phosphor layer.

20 Claims, 4 Drawing Sheets

LED ARRANGEMENT

CROSS REFERENCE TO RELATED APPLICATION

Pursuant to 35 U.S.C. § 120, this application is a divisional application of U.S. application Ser. No. 11/119,403, filed Apr. 29, 2005 now U.S. Pat. No. 7,208,769, which claims the benefit of German Application No. 102004021233.3, filed Apr. 30, 2004. The contents of the prior applications are incorporated herein by reference in their entirety.

TECHNICAL FIELD

This invention relates to an LED (light-emitting diode) arrangement and a method of fabricating such an LED arrangement.

BACKGROUND

The document U.S. Pat. No. 6,657,379 B2 concerns an LED arrangement comprising at least one LED that emits light in a wavelength range of 300 to 485 nm. The emitted light is partially or completely converted into preferably longer-range radiation by phosphors that are exposed to the primary radiation of the LED. The LED chip is disposed in a recess in a housing. The walls of the housing are implemented as reflective, and the recess is filled with a compound that completely envelops the LED chip. The phosphor particles for converting the light given off by the LED chip are intermixed with this compound.

The document DE 100 204 65 A1 describes a radiation-emitting semiconductor component comprising a luminescence conversion element. Here, an LED chip is disposed in a recess in a base body. Inside the recess in the housing, a dish-like region is hollowed out around the semiconductor body to contain a luminescence conversion element that envelops the diode chip. The inner lateral surfaces of the dish-like region are implemented as reflective. The rest of the recess is filled with a transparent compound.

It is an object of the instant invention to specify an LED arrangement that can be fabricated in a particularly cost-effective manner. It is further an object of the invention to specify a method of fabricating such an LED arrangement.

This object is achieved by means of an LED arrangement as set forth below.

SUMMARY

An LED arrangement is specified that comprises at least one LED chip. The LED chip possesses a radiation decoupling surface. The radiation decoupling surface is, for example, formed by one of the surfaces of the LED chip. The bulk of the electromagnetic radiation generated in the LED chip is decoupled via this radiation decoupling surface.

Arranged on the radiation decoupling surface is at least one phosphor layer. Said phosphor layer preferably contains a matrix into which a luminescence conversion material is mixed. The term "luminescence conversion material" herein is to be understood as a material comprising constituents by means of which the electromagnetic radiation decoupled through the radiation decoupling surface is converted into electromagnetic radiation of a modified wavelength. Hence, the phosphor layer serves to convert the electromagnetic radiation generated by the LED chip into electromagnetic radiation of another wavelength. The phosphor layer is particularly preferably between 10 and 50 µm thick.

Furthermore, the LED chip is embedded in a housing. That is, the LED chip is preferably enveloped form-fittingly by a housing, the surface of the phosphor layer opposite the radiation decoupling surface of the LED chip being at least partially not covered by the housing.

In a preferred embodiment of the LED arrangement, a first contact layer is applied sidewardly to the radiation decoupling surface. That is, the contact layer is for example disposed in a corner of the radiation decoupling surface. In this case, the first contact layer covers only a small portion of the radiation decoupling surface and serves to effect electrical contacting of the LED chip. The contact layer preferably contains a metal. The sideward arrangement of the contact layer advantageously achieves the effect that by far the majority of the radiating surface of the contact layer is uncovered and the electromagnetic radiation generated in the LED chip can therefore be decoupled through the radiation decoupling surface unimpeded. The contact layer preferably forms the cathode of the LED chip.

Particularly preferably, the contact layer forms a bonding pad for contacting the LED chip by means of, for example, wire bonding. This means that the LED chip is preferably contacted electrically via the contact layer by means of a lead. Both the contact layer and the lead are preferably enveloped by the housing. This also advantageously increases the mechanical stability of the connection between the bonding pad and the lead. That is, the contact layer is also covered, at least in places, with housing material.

In a further preferred embodiment of the LED arrangement, the radiation-generating layer of the LED chip is arranged between a reflecting layer and the radiation decoupling surface. This reflecting layer has proven particularly advantageous both for the radiation intensity of the LED chip and for the conversion of the emitted light. For instance, radiation generated in the radiation-generating layer that is, for example, reflected back into the LED chip by a particle of the luminescence conversion material is re-reflected by the mirror face of the reflecting layer and thus can again be decoupled through the radiation decoupling surface. The light output of such an LED arrangement is therefore particularly high.

The radiation-generating layer is particularly preferably implemented as an epitaxial layer sequence, and comprises, for example, a multi-quantum-well structure for generating the electromagnetic radiation.

In a particularly preferred embodiment of the LED arrangement, the LED chip is a thin-film LED chip. Such a thin-film LED chip is distinguished in particular by the following features:

Applied to or formed on a first main surface of the radiation-generating epitaxial layer sequence of the LED chip, which surface faces a carrier element, is a reflecting layer that reflects back at least some of the electromagnetic radiation generated in the radiation-generating layer.

The radiation-generating layer has a thickness in the region of 20 µm or less, particularly in the region of 10 µm.

The radiation-generating layer comprises at least one semiconductor layer that has at least one surface with an intermixed structure, which in the ideal case brings about a nearly ergodic distribution of the light in the radiation-generating layer, i.e., said layer has a scattering behavior that is as ergodic as possible.

A basic principle of a thin-film LED chip is described, for example, in I. Schnitzer et al., Appl. Phys. Lett. 63 (16, 18), October 1993, 2174-2176, whose disclosure content in that regard is incorporated herein by reference.

A thin-film LED is, as a good approximation, a Lambertian surface radiator, and is therefore particularly well suited for use in a searchlight or headlight.

In a particularly preferred embodiment of the LED diode arrangement, the housing in which the LED chip is embedded is implemented as radiation-absorbing. "Radiation-absorbing" in this context means, for example, that the housing is implemented as absorptive of either the electromagnetic radiation emitted by the LED chip or the environmental light. Such a housing preferably contains black mold compound. Said mold compound can, for example, be blackened with soot. The blackening of the mold compound advantageously creates good contrast between the light exit surface of the LED arrangement and the surrounding housing. Improving the housing by making it radiation-absorbing has proven particularly advantageous, since it permits a defined light output. The electromagnetic radiation generated in the LED chip can therefore leave the LED arrangement substantially only at the locations intended for that purpose, i.e., through the radiation decoupling surface and thus through the phosphor layer. Thus, since nearly all the radiation generated in the LED chip leaves the arrangement through the phosphor layer, the radiation-absorbing housing also contributes to particularly effective conversion of the emitted radiation.

In a further preferred embodiment, a covering body is disposed on the phosphor layer. The covering body is advantageously formed substantially of a material whose thermal expansion coefficient is the same or very nearly the same as the thermal expansion coefficient of the phosphor layer. The covering body is preferably formed in the same material system as the matrix of the phosphor layer. This advantageously reduces mechanical stress on the LED arrangement during the operation of the LED chip.

The covering body is particularly preferably implemented as an optical element. The optical element advantageously affords the possibility of adapting the radiation characteristic of the LED arrangement to the area of application of said arrangement. In particular, the optical element can in this case be implemented as a refractive or diffractive lens.

In a particularly preferred embodiment of the LED arrangement, the LED chip is disposed on a carrier. The LED chip is preferably bonded to the carrier. The carrier preferably serves to effect both mechanical attachment and electrical contacting of the LED chip. To this end, the carrier is preferably structured appropriately. That is, the carrier comprises, for example, electrical leads and connection sites for contacting the chip.

In a particularly preferred embodiment of the LED arrangement, said LED arrangement comprises a multiplicity of LED chips. The arrangement of the LED chips with respect to one another is preferably adapted to the use requirements of the LED arrangement. For example, the geometrical arrangement of the LED chips can be adapted to the location where the LED arrangement is to be used. The shape of the carrier and of the housing can also be suitably adapted to such use requirements.

The LED arrangement as a whole makes use, inter alia, of the idea that the combination of an LED chip comprising a highly reflective mirror layer and a thin phosphor layer disposed on the radiation decoupling surface permits very efficient conversion of the emitted radiation, since the bulk of the electromagnetic radiation generated in the LED chip is decoupled through the conversion layer. Advantageously, the defined overmolding of the LED chip with a radiation-absorbing mold compound as a housing results in good contrast values and defined decoupling of the electromagnetic radiation through the radiation decoupling surface and thus the phosphor layer.

Further specified is a method of fabricating an LED arrangement, comprising the following steps:
  a) preparing a carrier,
  b) attaching an LED chip comprising a radiation decoupling surface to one surface of the carrier,
  c) embedding the LED chip in a housing,
  d) applying a phosphor layer to the radiation decoupling surface of the LED chip.

It should be noted in particular that the method steps can theoretically be performed in any desired order; the order given here by the alphabetically arranged letters need not necessarily be followed.

In a particularly preferred embodiment of the method, in Step b) of the method the LED chip is both mechanically attached to the carrier and electrically contacted.

In Step d) of the described method, at least portions of the radiation decoupling surface preferably remain uncovered. This can be achieved, for example, by covering portions of the radiation decoupling surface with a mask before embedding the LED chip in the housing envelope.

In a further preferred embodiment of the method, a covering body is applied to the phosphor layer after the completion of the described method. This covering body advantageously covers the phosphor completely. The covering body is, for example, prefabricated prior to the application of the phosphor layer. It can then be glued to the phosphor layer. It is also, however, possible for the covering-body material to be sprayed onto the phosphor layer, shaped as desired and then cured.

Particularly preferably, the housing in which the LED chip is embedded is implemented as radiation-absorbing. This means that the housing material is suitable for absorbing at least the bulk of the electromagnetic radiation that is generated in the LED chip and impinges on the housing.

In a particularly preferred embodiment of the method, a multiplicity of LED chips is attached to the carrier. Both the shape of the carrier and the arrangement of the LED chips thereon can advantageously be adapted to the use requirements of the arrangement.

Both the here-described arrangement and a method of fabricating such an LED arrangement are described in more detail below on the basis of embodiment examples and the associated figures.

DETAILED DESCRIPTION

Figure 1:
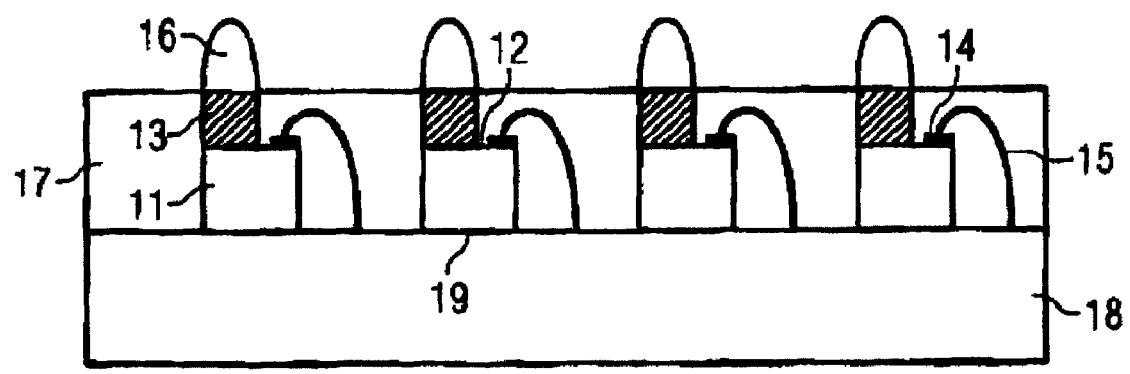
FIG. 1 is a schematic diagram of an LED arrangement as described herein.

In the embodiment examples and the figures, like or like-acting elements are provided with the same reference numerals. The illustrated elements and the sizes of the elements with respect to one another should not be considered true to scale. Rather, some details of the figures have been exaggerated in size to improve comprehension.

FIG. 1 shows the here-described LED arrangement, comprising LED chips 11. Each LED chip 11 has on its top face a radiation decoupling surface 12. Applied to a portion of radiation decoupling surface 12 is a phosphor layer 13.

Phosphor layer 13 advantageously contains a mixture of a luminescence conversion material and a matrix. Said matrix is formed, for example, of duroplastic polymers such as epoxy materials or silicone materials. The concentration of luminescence conversion material is advantageously high. Particularly preferably, between 30 and 50 vol. % of phosphor material is mixed with the matrix. Luminescence conversion materials can be doped garnets such as YAG or TAG, chlorosilicates, alkaline-earth nitridosilicates or alkaline-earth oxynitride silicates. Suitable luminescence conversion materials are described, for example, in the document WO 98/12757, whose content in that regard is incorporated herein by reference.

Phosphor layer 13 is advantageously applied to radiation decoupling surface 12 with a doctor blade in a relatively thin between 10 and 50 µm thick, or printed on by means of special printing techniques such as silk screening or buffer printing. However, it is also possible alternatively for the luminescence conversion material to be applied to radiation decoupling surface 12 by means of a dispensing technique, such as for example an inkjet process, or by means of a piezo-valve dispenser.

A second portion of the radiation decoupling surface is covered by a first contact layer 14 forming a bonding pad. Above this first contact layer 14, LED chip 11 is electrically contacted by means of a lead 15, for example by wire bonding. First contact layer 14 advantageously contains aluminum and forms the n-side connection of the LED chip.

A covering body 16 is disposed on phosphor layer 13. This covering body 16 preferably forms an optical element that affords the possibility of adjusting the radiation characteristic of the LED arrangement according to the needs of said LED arrangement. Both refractive and diffractive optical elements can be used for this purpose. To this end, the side faces of covering body 16 preferably are substantially parabolically, hyperbolically or elliptically curved.

Since in the described LED arrangement the emission surface of phosphor layer 13 is very similar to the chip emission surface, i.e., radiation decoupling surface 12, the LED arrangement is particularly well suited for such additional optical elements. Nearly all the light emitted by LED chip 11 is converted in the phosphor layer and can then exit the arrangement through covering body 16.

Covering body 16 is advantageously formed in the same material system as the matrix of phosphor layer 13. This has proven particularly advantageous during the operation of the LED chip 11, since covering body 16 and phosphor layer 13 then have roughly equal thermal expansion coefficients and the connection between phosphor layer 13 and covering body 16 is placed under very little stress by the heat given off by the LED chip 11.

The LED chips 11 are embedded in a housing 17; hence, the side faces of the LED chips 11 and portions of radiation decoupling surface 12 are enveloped form-fittingly by said housing 17. The leads 15 are also advantageously enveloped by the housing material. This increases the mechanical stability of the connection between lead 15 and first contact layer 14.

Particularly advantageously, the side faces of phosphor layer 13 are also enveloped form-fittingly by housing 17. Since housing 17 is preferably implemented as radiation-absorbing, for example black, the LED arrangement has, in the form of the surface of phosphor layer 13 opposite radiation decoupling surface 12, a defined light exit surface with good contrast to the surrounding housing 17. Housing 17 preferably contains a mold compound, such as duroplastic polymers (epoxy materials or silicone materials). The mold compound is preferably implemented as radiation-absorbing. That is, the bulk of the electromagnetic radiation emitted by the LED chip and impinging on the mold compound is absorbed by the latter. In this way, the escape of radiation is deliberately limited to regions of radiation exit surface 12 that are covered by phosphor layer 13. The mold compound is, for example, blackened with soot. Such a mold compound can be selected so that its thermal expansion coefficient is well adapted to the other elements of the LED arrangement, thus imparting high mechanical stability to the arrangement.

LED chip 11 and housing 17 are advantageously disposed on a carrier 18. Carrier 18 can, for example, be a printed circuit board (PCB), a ceramic, a direct-bonded copper substrate (DBC) or a metal-core board, or it can be formed generally of structurable materials, such as silicon, for example.

Second contact layer 19 serves both to attach the LED chips mechanically to the carrier and to contact them electrically, for example by means of a die-bonding process. Second contact layer 19 preferably forms the p-side connection of LED chip 11. Lead 15 is also connected to carrier 18 to effect n-side contacting of the LED chip 11.

Figure 2A:
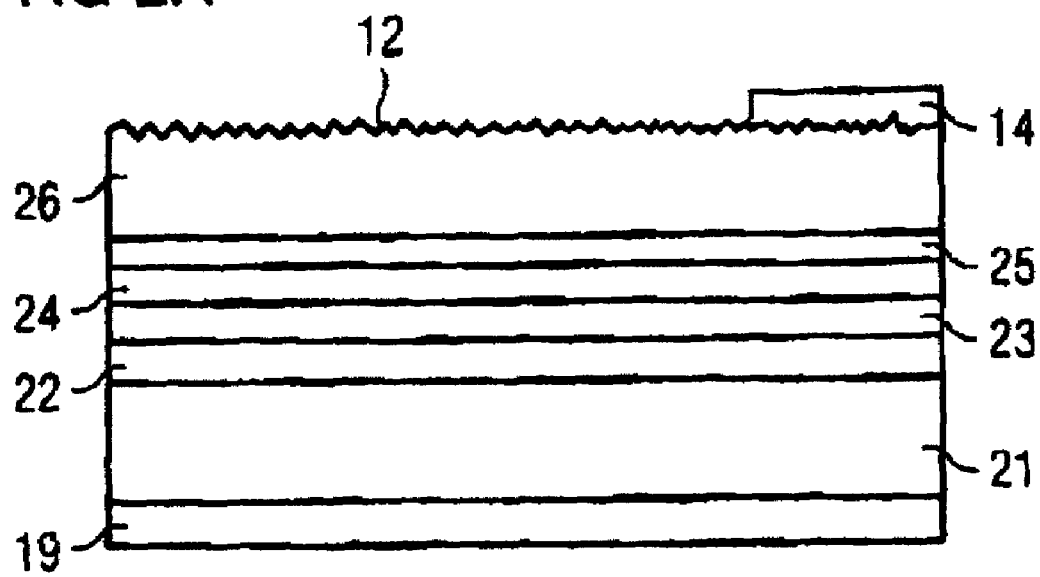
FIG. 2 shows an LED chip of a kind that can be used in the described arrangement.

FIG. 2A is a sectional diagram of an LED chip 11 of a kind that can be used in the LED arrangement. Suitable LED chips are, for example, surface-emitting semiconductor chips based on the thin-film concept, which include a highly reflective layer 23 under radiation-generating layer 25. Disposed on the bottom face of the LED chip is p-side second contact layer 19. Second contact layer 19 is applied to a carrier element 21.

Carrier element 21 is followed by the reflective layer 23, which is fastened to carrier element 21 by a solder layer 22. Reflective layer 23 forms a mirror layer and is preferably formed of a metal. In that case, reflective layer 23 can contain, for example, silver.

The mirror layer is followed by a buffer layer 24, which for example contains p-doped GaN and is transparent to the radiation generated in radiation-generating layer 25. Radiation-generating layer 25 advantageously includes more than one epitaxially grown layer. It is based, for example, on a nitride composite semiconductor material, i.e., at least one layer of the epitaxially grown layer sequence comprises a material from the system $In_xAl_yGa_{1-x-y}N$, where $0 \leq x \leq 1$, $0 \leq y \leq 1$ and $x+y \leq 1$. In addition, radiation-generating layer 25 can have a multi-quantum-well structure. A single-quantum-well structure, a double heterostructure or a single heterostructure can also be used instead of the multi-quantum-well structure. In the context of this patent application, the term "quantum-well structure" encompasses any structure in which charge carriers undergo quantization of their energy states by confinement. In particular, the term "quantum-well structure" implies no statement as to the dimensionality of the quantization. It therefore includes, among other things, quantum wells, quantum wires and quantum dots and any combination of these structures.

Radiation-generating layer 25 is topped by cover layer 26, which preferably contains n-doped GaN. Cover layer 26 is preferably transparent to the electromagnetic radiation generated in radiation-generating layer 25. It comprises on its upper surface the radiation decoupling surface 12, which is advantageously for example randomly structured.

This structuring of radiation decoupling surface 12 advantageously achieves the effect that total reflection of the radiation emitted by the LED chip occurs less often than it would in the case of a smooth radiation decoupling surface 12. In addition, suitable structuring of radiation decoupling surface 12 can cause the stochastic scattering behavior of the LED chip to be nearly ergodic.

Figure 2B:
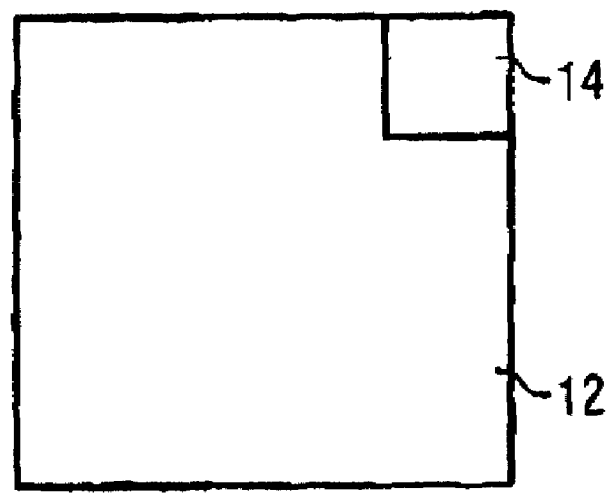

First contact layer 14 is disposed sidewardly on radiation decoupling surface 12. FIG. 2B is a plan view of the LED chip with radiation decoupling surface 12 and with first contact layer 14 disposed in a sideward corner. Due to this sideward arrangement of first contact layer 14, first contact layer 14 takes up little surface area on radiation decoupling surface 12 and therefore scarcely impedes the escape of the electromagnetic radiation through radiation decoupling surface 12.

FIGS. 3A to 3G show an embodiment example of a described method of fabricating the LED arrangement.

Figure 3A:
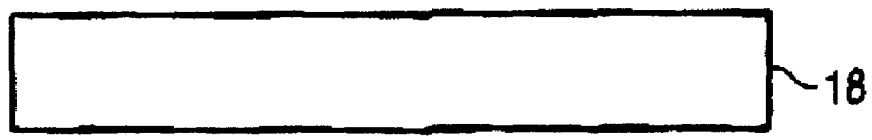
FIG. 3 (a to g) depicts an embodiment example of a method as described herein.

FIG. 3A is a sectional diagram of the carrier 18.

Figure 3B:
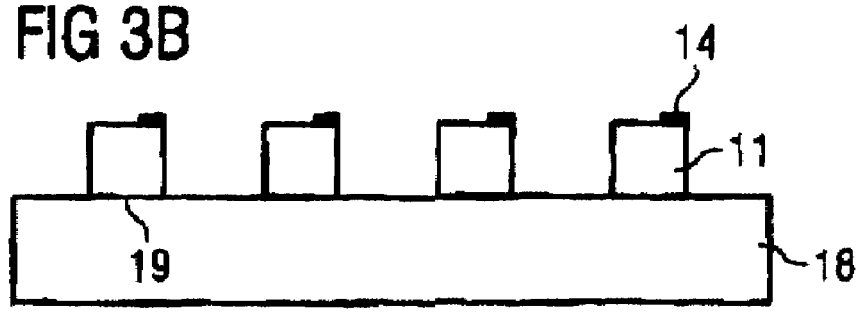

In a first method step, the LED chip 11 is mechanically attached to carrier 18 by die bonding and electrically contacted to carrier 18 via second contact layer 19 (see FIG. 3B).

Figure 3C:
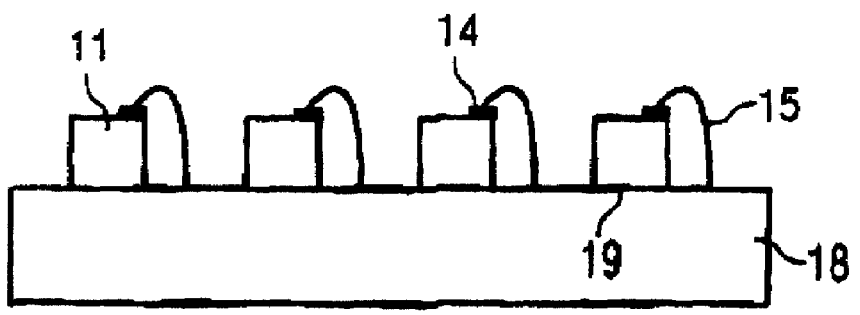

FIG. 3C shows the electrical contacting of the LED chip to carrier 18 by means of leads 15. This contacting is done by a wire-bonding process in which the lead 15 is attached to carrier 18 and first contact layer 14, which forms a bonding pad.

Figure 3D:
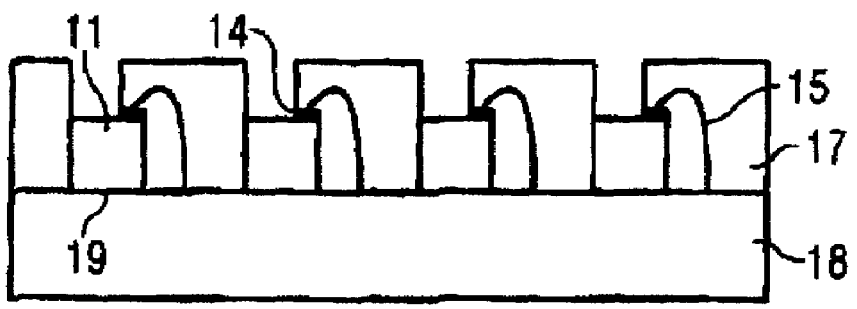

In the next method step, the LED chip is embedded in a housing 17 (see FIG. 3D). To this end, the LED chip is enveloped form-fittingly by black mold compound by an injection-molding process or other suitable method, such as printing processes, for example. To keep part of the radiation decoupling surface free of mold compound so that the phosphor layer 13 can subsequently be applied to it, a mask can be used that keeps these locations on radiation decoupling surface 12 bare. Alternatively, the portions of radiation decoupling surface 12 to which phosphor layer 13 is to be applied can be re-exposed by etching after molding. It is further possible for phosphor layer 13 to be to be applied to radiation decoupling surface 12 of the LED chip even before overmolding. In particular, phosphor layer 13 can be applied to radiation decoupling surface 12 as early as the wafer composite stage.

During the overmolding of the LED chip 11, the upper surface of the carrier not covered by the LED chip is also advantageously enveloped form-fittingly by molding compound. The first contact layers 14 and the leads 15 are also preferably overmolded as well. This results in mechanical stabilization of the LED arrangement. The molding compound can also advantageously be admixed with fillers (for example adhesion mediators or CTE) for good adaptation of the housing to the carrier. For example, this can be done to adapt the thermal expansion coefficient of the housing to that of the carrier. This measure advantageously increases the mechanical stability of the arrangement.

Figure 3E:
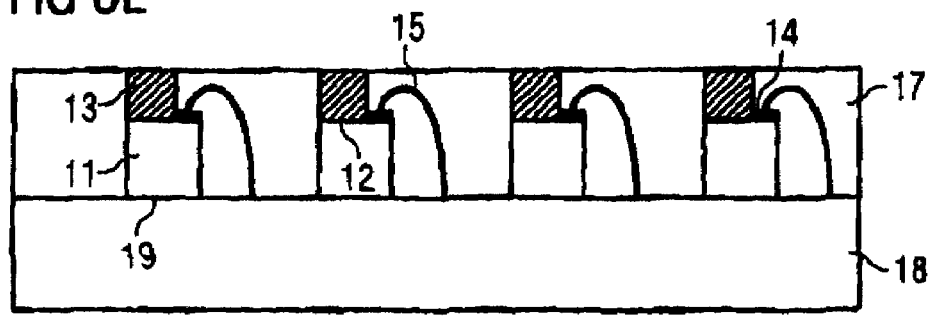

FIG. 3E shows the application of phosphor layer 13 to radiation decoupling surface 12. The side faces of phosphor layer 13 are also advantageously enveloped by the housing material, so that electromagnetic radiation generated in radiation-generating layer 25 exits for the most part through the surface of phosphor layer 13 that is opposite radiation decoupling surface 12.

Figure 3F:
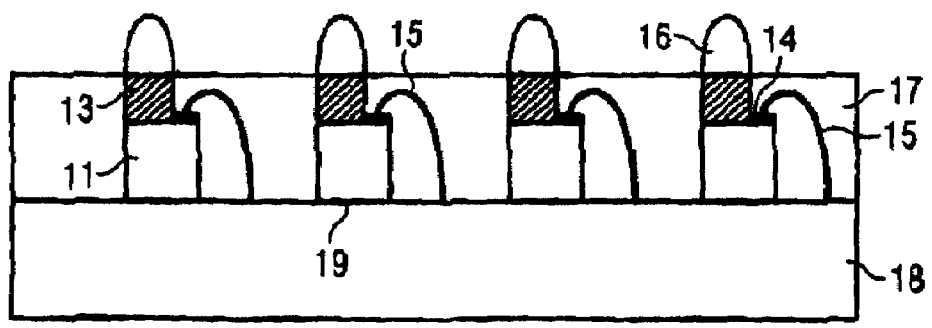
Figure 3G:
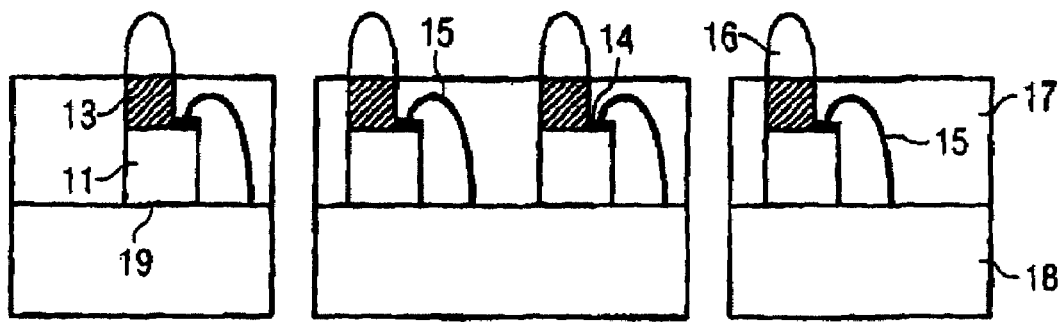

FIG. 3F illustrates the application of the covering body 16 to phosphor layer 13. This covering body 16 can, for example, be composed of prefabricated optical elements, which are glued onto phosphor layer 13. However, it is also possible, for example, for covering body 16 to be printed onto the not-yet-cured phosphor layer 13 and form a permanent mechanical connection with phosphor layer 13 once it has cured.

Alternatively, covering body 16 can be sprayed onto phosphor layer 13. In this case, use can be made of thixotropic materials that are sprayed onto phosphor layer 13 and are then given the desired shape. In this case the covering body preferably contains silicone. It is also possible to apply high-surface-tension materials to phosphor layer 13 in droplet form and then cure them, optionally using ultraviolet radiation.

In a further method step (see FIG. 3G), the LED arrangement can be singulated so as to yield LED arrangements possessing the desired shape and number of LED chips 11. Alternatively, the LED arrangement can, of course, be fabricated in the desired shape and with the desired number and arrangement of LED chips 11 right from the start.

This patent application claims the priority of German Patent Application 102004021233.3-33, whose disclosure content is incorporated herein by reference.

The invention is not limited by the description based on the embodiment examples. Rather, invention encompasses any novel feature and any combination of features, including in particular any combination of features recited in the claims, even if said feature or said combination itself is not mentioned explicitly in the claims or the embodiment examples.

What is clamed is:

1. A method of fabricating an LED arrangement, comprising the following steps in the following order:
   a) preparing a carrier,
   b) attaching to said carrier an LED chip comprising a radiation decoupling surface,
   c) embedding said LED chip in a housing, such that said LED chip is enveloped by said housing with said housing in contact with and partially covering the radiation decoupling surface of said LED chip,
   d) applying a phosphor layer to said decoupling surface of the LED chip.

2. The method of fabricating an LED arrangement as set forth in claim 1, wherein a covering body is disposed on said phosphor layer.

3. The method of fabricating an LED arrangement as set forth in claim 1, wherein the housing is configured to absorb radiation generated in the LED chip that impinges on the housing.

4. The method of fabricating an LED arrangement as set forth in claim 1, wherein a multiplicity of LED chips is attached to said carrier.

5. The method of fabricating an LED arrangement as set forth in claim 1, wherein said LED chip is enveloped by a mold compound.

6. The method of fabricating an LED arrangement as set forth in claim 5, wherein said LED chip is enveloped by an injection-molding process.

7. The method of fabricating an LED arrangement as set forth in claim 5, wherein said LED chip is enveloped by a printing process.

8. The method of fabricating an LED arrangement as set forth in claim 1, wherein a covering body is arranged on said phosphor layer.

9. The method of fabricating an LED arrangement as set forth in claim 8, wherein the covering body is implemented as an optical element.

10. The method of fabricating an LED arrangement as set forth in claim 8, wherein the phosphor layer contains a matrix material into which a luminescence conversion material is mixed and the covering body contains the same matrix material.

11. The method of fabricating an LED arrangement as set forth in claim 8, wherein the covering body is composed of a prefabricated optical element which is glued onto said phosphor layer.

12. The method of fabricating an LED arrangement as set forth in claim 8, wherein the covering body is pushed into the not-yet-cured phosphor layer and a permanent mechanical connection between said phosphor layer and the covering body is formed by curing of said phosphor layer.

13. The method of fabricating an LED arrangement as set forth in claim 1, wherein said LED chip is a thin-film LED chip.

14. A method of fabricating an LED arrangement, comprising the following steps in the following order:
- a) preparing a carrier,
- b) attaching to said carrier an LED chip comprising a radiation decoupling surface,
- c) embedding said LED chip in a housing,
- d) applying a phosphor layer to said decoupling surface of the LED chip;
- wherein a covering body is arranged on said phosphor layer, the covering body composed of a prefabricated optical element which is glued onto said phosphor layer.

15. The method of fabricating an LED arrangement as set forth in claim 14, wherein the housing is configured to absorb radiation generated in the LED chip that impinges on the housing.

16. The method of fabricating an LED arrangement as set forth in claim 14, wherein a multiplicity of LED chips is attached to said carrier.

17. The method of fabricating an LED arrangement as set forth in claim 14, wherein said LED chip is enveloped by a mold compound.

18. The method of fabricating an LED arrangement as set forth in claim 17, wherein said LED chip is enveloped by an injection-molding process.

19. The method of fabricating an LED arrangement as set forth in claim 17, wherein said LED chip is enveloped by a printing process.

20. The method of fabricating an LED arrangement as set forth in claim 14, wherein said LED chip is a thin-film LED chip.

\* \* \* \* \*